US006784820B1

(12) United States Patent
Casalegno et al.

(10) Patent No.: US 6,784,820 B1
(45) Date of Patent: *Aug. 31, 2004

(54) HIGH RESOLUTION, HIGH DYNAMIC RANGE ANALOG-TO-DIGITAL CONVERTER SYSTEM AND RELATED TECHNIQUES

(75) Inventors: James William Casalegno, Bristol, RI (US); Frank Philip Monte, Newport, RI (US); Eric Kent Slater, Long Beach, CA (US); Kirk K. Kohnen, Fullerton, CA (US)

(73) Assignee: Raytheon Company, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/409,844

(22) Filed: Apr. 9, 2003

(Under 37 CFR 1.47)

(51) Int. Cl.[7] ................................. H03M 1/12
(52) U.S. Cl. ...................... 341/155; 341/156
(58) Field of Search ............... 341/155, 118, 341/120, 156, 166

(56) References Cited

U.S. PATENT DOCUMENTS

| 4,876,544 | A | * | 10/1989 | Kuraishi ................... 341/166 |
| 5,392,039 | A | * | 2/1995 | Thurston ................... 341/143 |
| 5,898,395 | A | * | 4/1999 | Werrbach et al. ........... 341/118 |
| 6,081,215 | A | * | 6/2000 | Kost et al. ................. 341/120 |
| 6,275,540 | B1 | * | 8/2001 | Barrett et al. .............. 375/316 |
| 6,437,717 | B1 | * | 8/2002 | Van der Ploeg et al. ..... 341/118 |
| 6,441,767 | B1 | * | 8/2002 | Frazier ...................... 341/155 |
| 6,445,329 | B1 | * | 9/2002 | Abassi et al. .............. 341/156 |

* cited by examiner

*Primary Examiner*—Jean Bruner Jeanglaude
(74) *Attorney, Agent, or Firm*—Daly, Crowley & Mofford, LLP.

(57) ABSTRACT

An analog-to-digital converter system for sampling an input signal includes at least one offset channel. Each channel includes a differential amplifier with a signal input coupled to the input signal, an offset input for receiving an offset signal and an amplified difference output, an analog-to-digital converter having a signal input coupled to the amplified difference output and having a signal output, and an offset index signal source coupled to the differential amplifier offset input. The system further includes an offset controller having at least one output coupled to a corresponding at least one offset index signal source and at least one input coupled to a corresponding at least one analog-to-digital converter signal output. The system also includes a signal constructor having at least one input coupled to a corresponding at least one analog-to-digital converter signal output and operable to provide a relatively high resolution digital output signal.

40 Claims, 9 Drawing Sheets

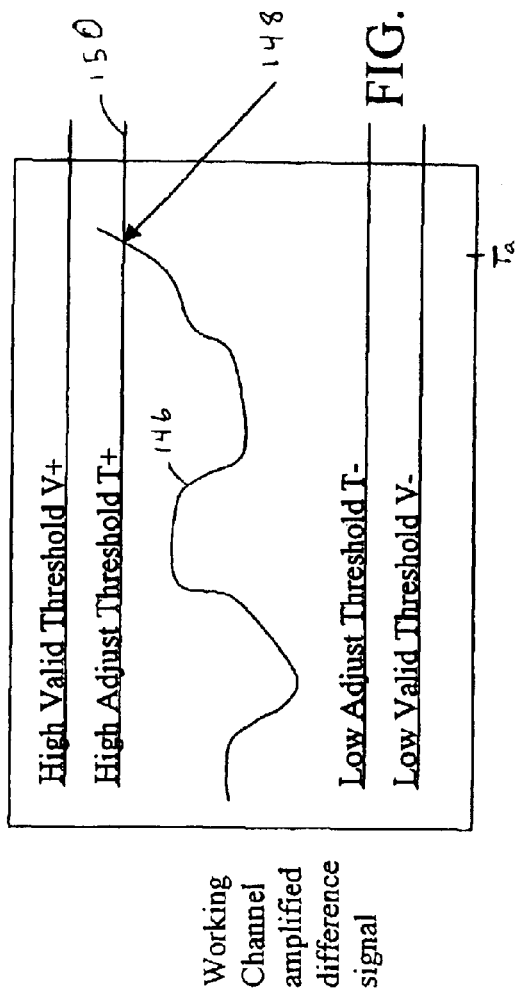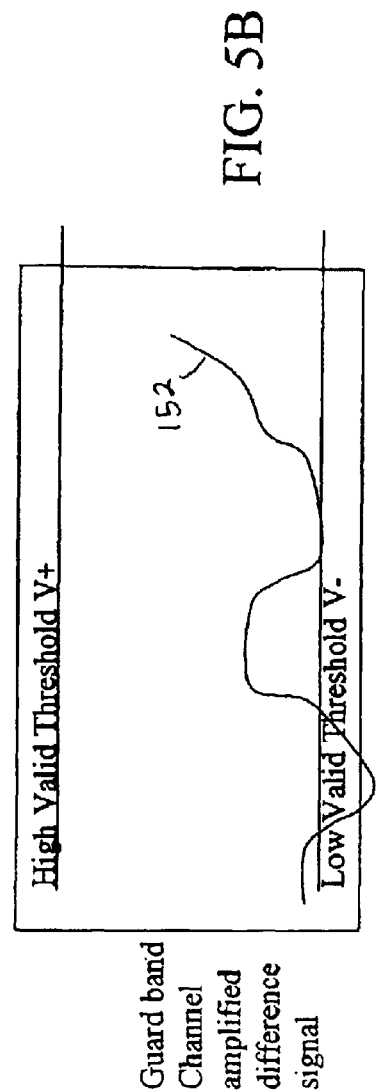
FIG. 5A
FIG. 5B

HIGH RESOLUTION, HIGH DYNAMIC RANGE ANALOG-TO-DIGITAL CONVERTER SYSTEM AND RELATED TECHNIQUES

CROSS-REFERENCE TO RELATED APPLICATIONS

Not applicable.

STATEMENTS REGARDING FEDERALLY SPONSORED RESEARCH

Not applicable.

FIELD OF THE INVENTION

This invention relates generally to analog-to-digital converters and more particularly to a high resolution, expanded dynamic range analog-to-digital converter.

BACKGROUND OF THE INVENTION

In signal processing applications, it is often desirable to detect small variations in a signal having relatively large background variation. Many digital signal processing applications require signal sensitivities well beyond the capabilities of existing analog-to-digital (A/D) converters. An example is the detection and exploitation of minute magnetic perturbations from objects of interest in the presence of the earth's substantially larger magnetic field. One method of extending the signal resolution is to subtract an offset and amplify the result so that only the amplified difference is presented to the A/D converter. Small signal variations due to the object of interest can then be observed successfully as long as the variations do not exceed the signal amplitude capabilities of the A/D device. This technique generally works well when the sensor measuring the signal is stationary relative to the large undesired signal component, but fails when relative motion of the sensor and undesired signal source cause large signal variations, such as when a vector magnetometer is mounted on a moving platform.

Other conventional approaches to measuring small signal variations in the presence of sensor instability have either been to stabilize the sensor or increase the resolution of the A/D device. Stabilizing the sensor is relatively expensive, requiring mechanical fixturing, actuators and a control loop to continuously and instantaneously adjust the sensor as needed to maintain a fixed orientation. Such a stabilized system has a finite response time and orientation errors that effectively introduce noise onto the signal being measured and fundamentally limit the achievable sensor sensitivity. Increasing the resolution of the A/D is generally not a cost effective or viable option in certain applications. Furthermore, the greater the resolution, the slower the sensor operates, thus preventing an A/D with adequate resolution from having a sufficient respone time.

A/D converters are in widespread use in electronics and computer applications for converting real-world signals into a digital domain for further processing. A/D converters are characterized by the number of bits of resolution and operating speed (i.e., number of samples per second). Typical high speed A/D converters have low resolution (i.e., a small number of bits in data word), and high resolution A/D converters are generally slow. For some applications, the performance of available A/D converters is inadequate. One means of extending the precision of an A/D converter is to offset the analog signal by the signal's average direct current (DC) value and then to amplify the analog signal level prior to A/D conversion. This technique can be used when the signal of interest includes small signal excursions around a DC value which is less important. The limitation of this approach occurs when the analog signal moves outside a valid range, causing the A/D converter and/or amplifier to saturate and invalidating the data.

The performance of a conventional magnetic sensor is limited by available analog to digital converters. The earth's magnetic field varies depending on where the sensor is located, but is typically in the range of ±45,000 nano Tesla (nT). A typical signal has a sub nT value on top of a 30,000 nT pedestal representing the earth's background field. The flux gate sensors are capable of handling the dynamic range of ±70,000 nT, and have noise floors of below 0.010 nT per square root Hz at 1 Hz. To digitize this signal with an LSB of 0.008 nT requires an A/D of at least 24 bits. While there are twenty-four bit A/Ds available, a careful inspection of the twenty-four bit A/D's specifications indicates that for the frequency band of interest (generally 4 milliHertz to 70 Hertz for magnetic sensors), the A/D performance is effectively well below twenty-four bits. For example, an Analog Devices 7716 sigma delta device nominally provides 22 bits of data, but at the lowest update rate the digitization noise is such that the device is equivalent to a nineteen or twenty bit A/D.

One solution to this problem uses a very stable digital-to-analog (D/A) converter to provide a voltage for subtracting the majority of the earth field pedestal before the input signal is digitized. Then the signal having the offset removed can be amplified before it is digitized. This technique provides an improvement of approximately 3 to 6 bits in the magnetometer example above resulting in a least significant bit (LSB) corresponding to about 0.002 nT. This method relies of the fact that sensor is stationary, so the underlying earth field is fairly constant; and also, that the removal of the DC pedestal does not adversely affect the system's ability to process the data and localize targets.

However, in a synthetic aperture application, the sensor is moved through the earth's field, thus the background is changing due to earth field gradients and due to the changing attitude of the vector sensor in the field. The conventional solutions do not work under these conditions because the offset needed to null the background is constantly changing.

U.S. Pat. No. 6,441,767, "Method and System for Adjusting a Threshold Control in an Analog-to-Digital Converter" describes a differential amplifier, an adjustable offset voltage, and a feedback mechanism for adjusting the offset voltage, for reducing unwanted offset voltages internal to the A/D converter that drift causing overvoltage clipping to occur at unpredictable voltage levels. U.S. Pat. No. 6,441,767 teaches amplifying an offset input signal to correct an internal error mechanism within the A/D converter, but does not describe extending the resolution or dynamic range of the A/D converter. U.S. Pat. Nos. 6,445,329 and 6,437,717 describe multi-stage A/D converters having multiple stages. U.S. Pat. No. 6,445,329 teaches the use of a reference voltage and offset voltage selection blocks to optimize subsequent subrange analysis blocks for linearity and operating speed. U.S. Pat. No. 6,437,717 teaches using the difference between the analog input signal and threshold values to correct offset errors. The accuracy of these multistage converters is limited by the ability to correctly track the input signal. Noise levels limit the converter performance to that of a lower resolution A/D converter. The noise level is relatively high when the input signal hovers near a value that causes the offsets to change state.

Subtracting an offset from the input signal generally adds noise to the output signal because the offset is never completely noise free. Obtaining a variable offset that is as accurate as the desired precision for the measurement is relatively difficult. Typically, the offset circuit is made up of a precision voltage reference and a voltage divider circuit. The precision reference can be relatively low noise (on the order of the desired measurement precision), but the voltage divider precision is a problem because the voltage divider component tolerances limit the accuracy of the voltage reference. This is true whether the voltage divider is made from discrete passive resistors or the resistors are fabricated in the silicon of an integrated circuit D/A. For example, 0.1% tolerance on resistors used in a voltage divider cause a 0.1% error. The 0.1% error is about 1000 times larger than one part per million accuracy which is desired in certain applications.

U.S. Pat. Nos. 6,445,329 and 6,437,717 teach computing a new offset each cycle and subtracting the offset from the input signal during the process of generating high resolution outputs. The precision in these conventional systems resulting from extra bits of resolution is negated by the added noise. Even though the offsets are computed each sample time, the computed offsets are often repeated. During the time when the offsets do not change, sample-to-sample values will actually include the noise due to the precision voltage reference. When the input hovers near a value that causes offset changes, maximum signal degradation occurs due to the voltage divider circuit within each offset generator. In effect, these systems include sample-to-sample noise from the precision voltage reference with a changing bias, and the amount of changing bias is data dependent. The data dependent changing bias adds a variable amount of alternating current (AC) noise.

It would, therefore, be desirable to provide an A/D converter having expanded resolution and extended, low noise, dynamic range when converting an input signal with a relatively large dynamic range and moderate slew rate.

SUMMARY OF THE INVENTION

In accordance with the present invention, an analog-to-digital converter system for sampling an input signal includes at least one offset channel. Each channel includes a differential amplifier with a signal input coupled to the input signal, an offset input for receiving an offset signal and an amplified difference output, an analog-to-digital converter having a signal input coupled to the amplified difference output and having a signal output, and an offset index signal source coupled to the differential amplifier offset input. The system further includes an offset controller having at least one output coupled to a corresponding at least one offset index signal source and at least one input coupled to a corresponding at least one analog-to-digital converter signal output. The system also includes a signal constructor having at least one input coupled to the corresponding at least one analog-to-digital converter signal output and operable to provide a relatively high resolution digital output signal. With such an arrangement, the system provides an A/D converter having expanded resolution and extended low noise, dynamic range when converting an input signal with a relatively large dynamic range and moderate slew rate.

In accordance with a further aspect of the present invention, a method for converting an analog input signal includes the steps of providing a plurality of offset channels coupled to the analog signal, selecting one of the plurality of offset channels as a working offset channel, and providing a different offset index to each of the plurality of offset channels to provide a corresponding plurality of offset signals. The method further includes subtracting the plurality of offset signals from the analog input signal to provide a corresponding plurality of difference signals, amplifying the plurality of difference signals, digitizing each of the plurality of amplified difference signals, calculating a threshold for the working offset channel sensing whether the amplified offset signal has exceeded the threshold of the working offset channel, and storing a working offset channel digitized amplified difference signal. Finally the method includes calculating a difference between the working offset channel digitized amplified difference signal and the stored working offset channel digitized amplified difference signal, and adjusting selected ones of the offset indices in response to sensing that the working offset channel digitized amplified difference signal has exceeded the threshold.

With such a technique, the input signal is tracked over its entire dynamic range and a relatively high resolution output signal is constructed by adding the sum of relatively high resolution sample-to-sample differences to an initial offset value. This technique extends the precision of available A/D devices without sacrificing dynamic range or adding appreciable noise. By providing a plurality of offset channels and amplifying the difference of the input signal and an adjustable DC offset in several offset channels simultaneously the precision of the A/D conversion is extended while retaining a relatively large dynamic range by tracking the analog input signal In one embodiment when used in conjunction with a magnetic sensor, the analog-to-digital converter system amplifys an offset version of the input signal prior to A/D conversion and provides a relatively large dynamic range by sensing when the amplified difference signal is approaching the amplitude limits of the A/D converter and adjusting the offset index to keep the amplified offset signal within range of the A/D converter. By namically adjusting the offset index, this technique achieves relatively high sensitivity despite sensor orientation instability.

Instead of a variable amount of AC noise, the present invention includes the 0.1% error as a DC bias on the absolute accuracy of the output. On a sample-to-sample basis the precision voltage reference noise is relatively lower than the AC noise of conventional systems.

BRIEF DESCRIPTION OF THE DRAWINGS

The foregoing features of this invention, as well as the invention itself, may be more fully understood from the following description of the drawings in which:

FIG. 5A is a graphical depiction illustrating a working channel amplified difference signal of the system of FIG. 2;

FIG. 5B is a graphical depiction illustrating a guard band offset channel amplified difference signal;

DETAILED DESCRIPTION OF THE INVENTION

Before providing a detailed description of the invention, it may be helpful to define some of the terms used in the description. The term "exceeding," as used herein in conjunction with high and low threshold values, refers to a signal having a higher value than the high threshold or a lower value than the low threshold.

Figure 1:
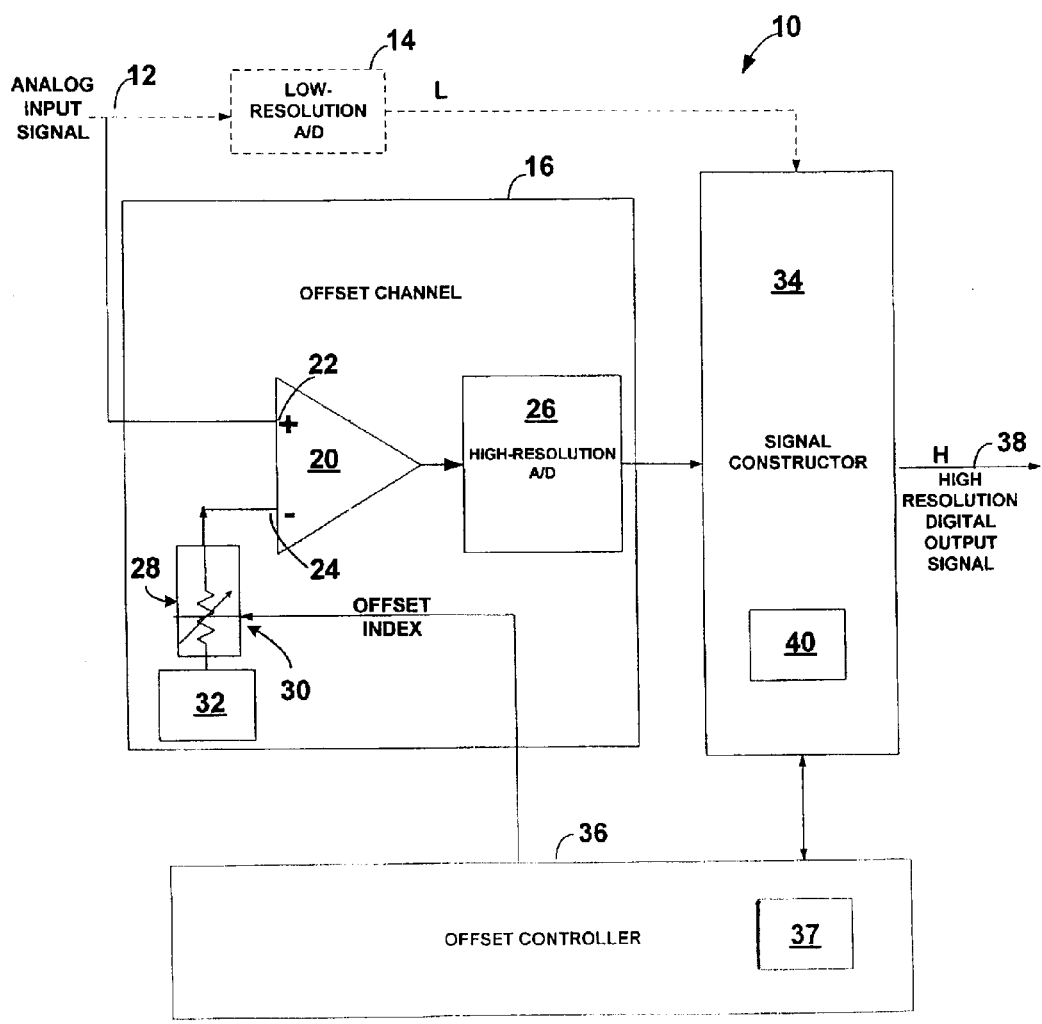
FIG. 1 is a block diagram of a high resolution, high dynamic range analog-to-digital converter system according to the invention.

Referring now to FIG. 1, an exemplary high resolution, high dynamic range analog-to-digital (A/D) converter system 10 includes an offset channel 16 coupled to an analog input signal 12. The offset channel 16 is coupled to a signal constructor 34 and an offset controller 36. The offset channel 16 includes a differential amplifier 20 having a signal input 22 coupled to the analog input signal 12 and an offset input 24 coupled to an offset index signal source 28. The differential amplifier 20 output is coupled to the input of a high resolution A/D converter 26. The output of the high resolution A/D converter 26 is coupled to the signal constructor 34. The signal constructor 34 includes a memory 40 and a relatively high resolution digital output signal 38. The offset index signal source 28 is coupled to the offset controller 36 and to a stable voltage source 32. The system 10 further includes an optional low resolution A/D converter 14 coupled to the analog input signal 12 and the signal constructor 34. The offset controller 36 includes a threshold detector 37 which is coupled to the digitized output of the high resolution A/D converter 26 and optionally coupled to the digitized output of the low resolution A/D converter 14.

In operation, the offset controller 36 provides a digital offset index 30 to the offset index signal source 28, here a digital trimpot. The offset index signal source 28 provides a digitally controlled stable and precise DC offset signal to the offset input 24 of the differential amplifier 20. The offset signal is subtracted from the incoming analog input signal 12 and the difference signal is amplified. The amplified difference output is digitized by the high-resolution A/D converter 26. The signal constructor 34 uses the digitized high-resolution A/D converter 26 output to provide the relatively high resolution digital output signal 38 (as described in detail in conjunction with FIGS. 3–4).

The offset controller 36 in conjunction with the signal constructor 34 determines whether the digitized high-resolution A/D converter 26 output is valid (i.e., whether the amplified difference signal is within the range of the high-resolution A/D converter 26), whether the amplified difference signal is slewing outside range of the high-resolution A/D converter 26, and when necessary adjusts the offset signal by adjusting the offset index 30. The low resolution A/D converter 14 has a range which is capable of converting the full range of the analog input signal and provides an initial digitized value of the analog input signal 12 which is used to set an initial offset index and to provide a base value used by the signal constructor 34. It will be appreciated by those of ordinary skill in the art that the need to adjust the offset index can be provided by monitoring signals from either the low resolution A/D converter 14 or the offset channel 16.

It will be appreciated by those of ordinary skill in the art that a variety of approaches is available to determine when to adjust the offset index of the offset channel 16. For example, using the high-resolution data from the digitized high-resolution A/D converter 26, the offset could be changed when the data value approaches exceeds a high threshold or a low threshold. Alternatively, using the low-resolution A/D converter 14 output signal, the offset is changed when the absolute value of the difference between the low-resolution output signal and the present offset exceed some threshold amount The threshold detection can be provided, for example, by a digital comparator, a software based comparison routine or a hardware or software determination that the high-resolution A/D converter 26 is clipping.

In one embodiment, the high resolution A/D converter 26 is a commercially available 22 bit A/D integrated circuit, for example as provided in an AD7716 made by Analog Devices Inc. The differential amplifier 20 is an operational amplifier, and the offset index signal source 28 is, for example, a digitally controlled potentiometer model X9C103 (also referred to as a digital trimpot), manufactured by Xicor Inc. The offset index signal source 28 is coupled to the precision voltage reference source 32. In this embodiment, the offset controller 36 and the signal constructor 34 are implemented in software in a single digital microcontroller, for example, the PIC 17C756 made by Microchip Technology, Inc. microcontroller. In this embodiment, the low resolution A/D 14 is a commercially available 12-bit A/D converter, for example, a TLV2543 available from Texas Instruments Inc. In an alternative embodiment, the signal constructor 34 is implemented in software in an external computing unit (not shown) that processes the high-resolution data.

The offset channel 16 optionally includes analog signal conditioning before the high-resolution A/D converter 26. In one embodiment, the difference signal is amplified by a factor of sixteen prior to being sampled by the high-resolution A/D converter 26. Since this can result in an amplified signal with potentially an 80 Volt swing when the input has a 5V swing, and the high-resolution A/D converter 26 can accommodate only a 5V swing, the offset derived from the digital trimpot 28 is subtracted from the analog input signal 12 before amplification and digitization. Consequently, the input can vary over only about 6% of its valid range before saturating the high-resolution A/D converter 26. It is understood that the offset channel 16 provides the relatively high-resolution sample-to-sample differences but with less precise DC value. Therefore, once the first value has been initialized, all subsequent values are generated as the sum of the previous value and the next relatively high-resolution sample-to-sample difference.

Figure 1A:
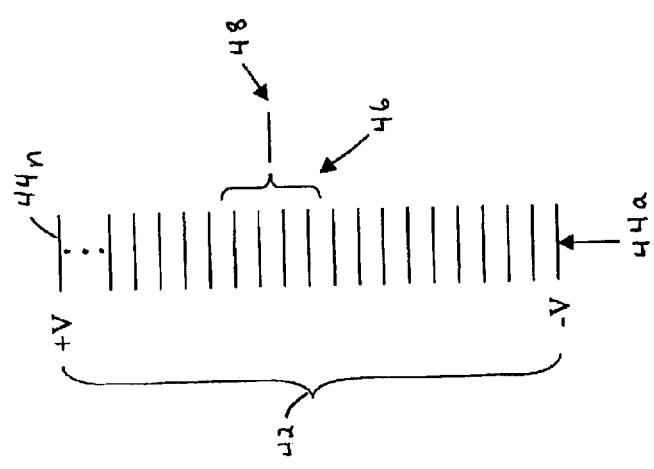
FIG. 1A is a diagram of a dynamic range of an offset channel of the system of FIG. 1.

Referring also to FIG. 1A, a diagram of a dynamic range 42 of an exemplary incoming analog input signal 12 of the system of FIG. 1 is shown. The dynamic range 42 spans a range voltages produced by the corresponding range of possible offset signals 44a–44n. For a given offset index 30, the offset channel 16 has an offset channel dynamic range 46 having a center 48 which is relatively close to the current value of the analog input signal 12.

Figure 2:
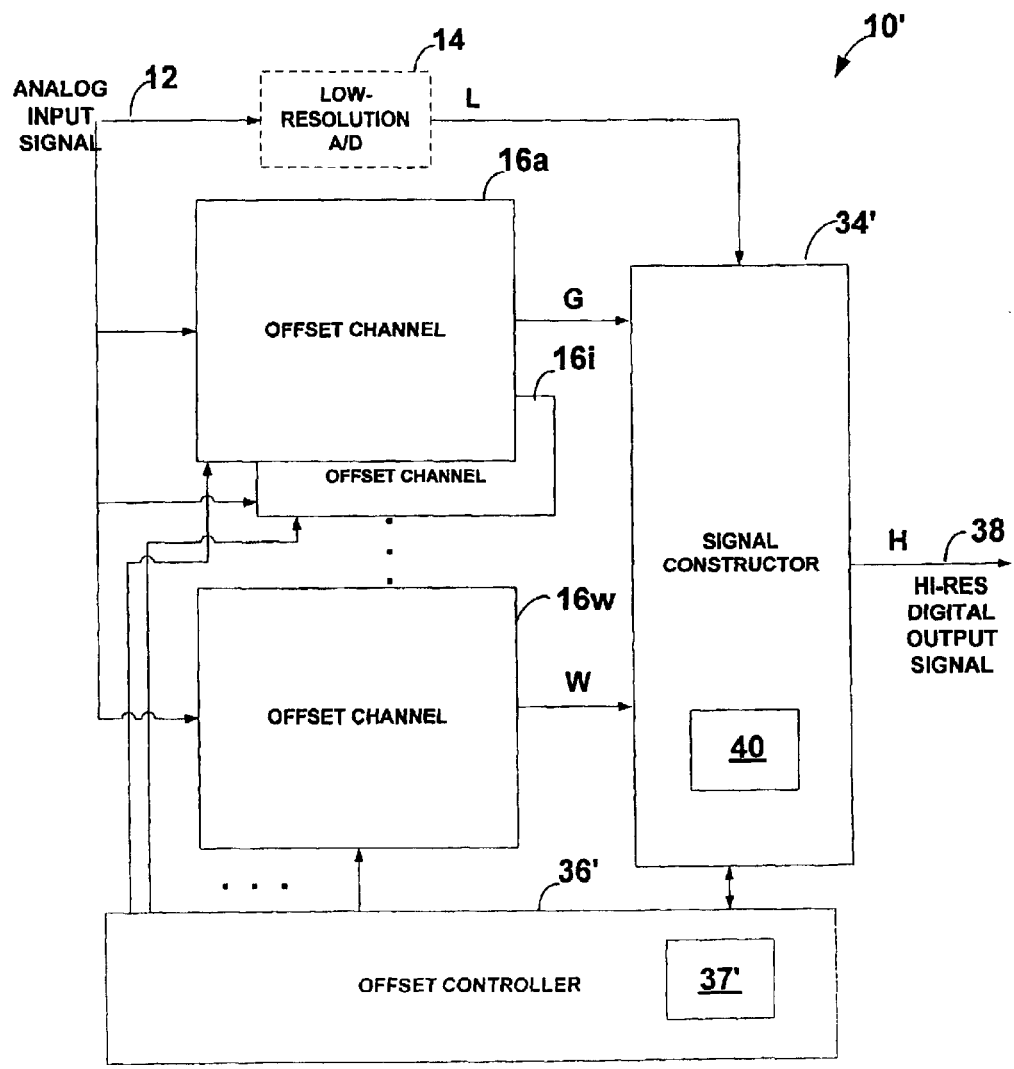
FIG. 2 is a block diagram of a high resolution, high dynamic range analog-to-digital converter system having multiple offset channels according to a further aspect of the invention.

Referring now to FIG. 2 in which like reference designations refer to like elements of FIG. 1, an exemplary multiple offset channel high resolution, high dynamic range analog-to-digital (A/D) converter system 10' includes a plurality of offset channels 16a–16i and 16w (similar to the offset channel 16 of FIG. 1) coupled to a signal constructor 34' and an offset controller 36'. As an alternative to the system of FIG. 1, the multiple offset channels 16a–16i and 16 are used with one offset channel (referred to as the working offset channel 16w) and at least one guard band offset channel 16a with an offset biased in the direction of the input drift. It is understood, that at any instance in time one of plurality of offset channels 16a–16i and 16w is designated as the working offset channel, here 16w, and the remaining offset channels 16a–16i are operating as guard band offset channels 16a–16i (also generally referred to as guard bands 16). Further, any one of the plurality of offset channels 16a–16i and 16w can be designated as the working offset channel 16w during operation of the analog-to-digital (A/D) converter system 10'.

The offset controller 36' includes a threshold detector 37' which is coupled to the digitized outputs of the high resolution A/D converters of the working offset channel 16w and the guard band offset channels 16a–16i. The threshold detector 37' is optionally coupled to the digitized output of the low resolution A/D converter 14. It will be appreciated by those of ordinary skill in the art that a single high precision voltage reference 32 can provide a stable high precision voltage to the plurality of digital trimpots 28 for each offset channel.

In operation, the offset controller 36' provides a different digital offset index to each of the plurality of offset channels 16a–16i and 16w which operate similarly to the offset channel 16 of FIG. 1 to provide digitized amplified difference outputs from each channel. The signal constructor 34' uses the digitized amplified difference high-resolution outputs to provide the relatively high resolution digital output signal 38 (as described in detail in conjunction with FIGS. 6–7). The offset controller 36' in conjunction with the threshold detector 37' and the signal constructor 34' determines whether the digitized high-resolution A/D converter 26 output is valid (i.e., whether the amplified difference signal is within the range of the high-resolution A/D), whether the amplified difference signal is slewing outside range of the high-resolution A/D. When necessary, the offset controller 36' adjusts the offset signal by adjusting the offset index 30 for one or more of the offset channels 16a–16i and 16w. The optional low resolution A/D converter 14 has a range which is capable of converting the full dynamic range of the analog input signal and provides an initial digitized value of the analog input signal which is used to set an initial offset index and to provide an amplified difference value used by the signal constructor 34'.

Figure 2A:
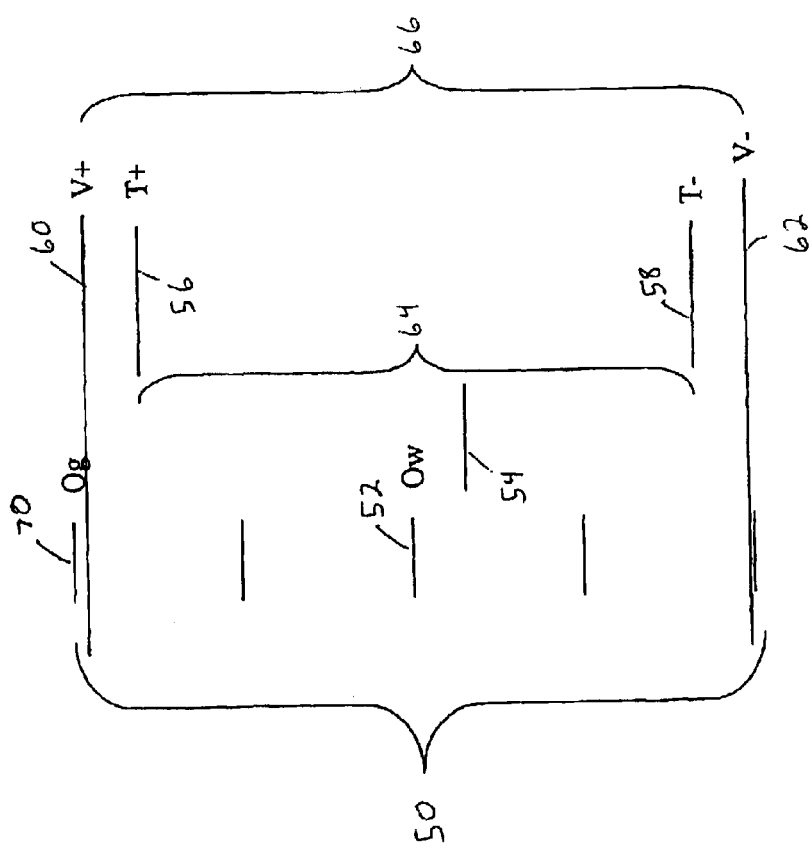
FIG. 2A is a diagram of a dynamic range of a working offset channel including thresholds and a dynamic range of a guard band offset channel of the system of FIG. 1.

Referring also to FIG. 2A, a diagram of a dynamic range 50 of an exemplary working offset channel 16w of the system of FIG. 1 is shown. Here the working offset channel 16w has an offset index $O_w$ 52 and the input signal 54 is within the dynamic range 50. In operation, a high offset adjust threshold T+ 56, a low offset adjust threshold T- 58, a high offset valid threshold V+ 60, and–, a low offset valid threshold V- 62 are set whenever the offset index $O_w$ 52 is initialized or modified. When using the output of the high resolution A/D 26 to compare to a threshold and thus change offset channels or invalidate an output, the thresholds are predetermined and set as required. For example, the adjust threshold is set such that if the output of the high resolution A/D 26 is greater than 90% of its range, then it is time to change the offset. Further, the valid threshold is set such that if the output of the high resolution A/D 26 is greater than 98% of its range, then the output is declared invalid. It will be appreciated by those of ordinary skill in the art that the percentages will vary depending on the application. When initially determining where to set the thresholds, the slew rate of an exemplary analog input signal 12 is examined. If the amplified difference signal can change by 10% of the A/D range in any one sample time, then the A/D output should not exceed 90% of its range, because then there is a chance that the next signal might cause the output to go beyond 100% of its value. Thus, the index adjust threshold is set at about 90% of the range. The valid threshold depends on the behavior of the high resolution A/D 26. For example, out of range inputs having outputs that cluster at the minimum or maximum output values are declared invalid.

An operating range 64 of offset $O_w$ corresponds to the range between the high offset adjust threshold T+ 56 and the low offset adjust threshold T- 58. A valid range 66 of offset $O_w$ corresponds to the range between the high offset valid threshold V+ 60 and the low offset valid threshold V- 62. An offset index $O_g$ 70 corresponds to the offset signal set for one of the nearby guard bands 16a.

Figure 3:
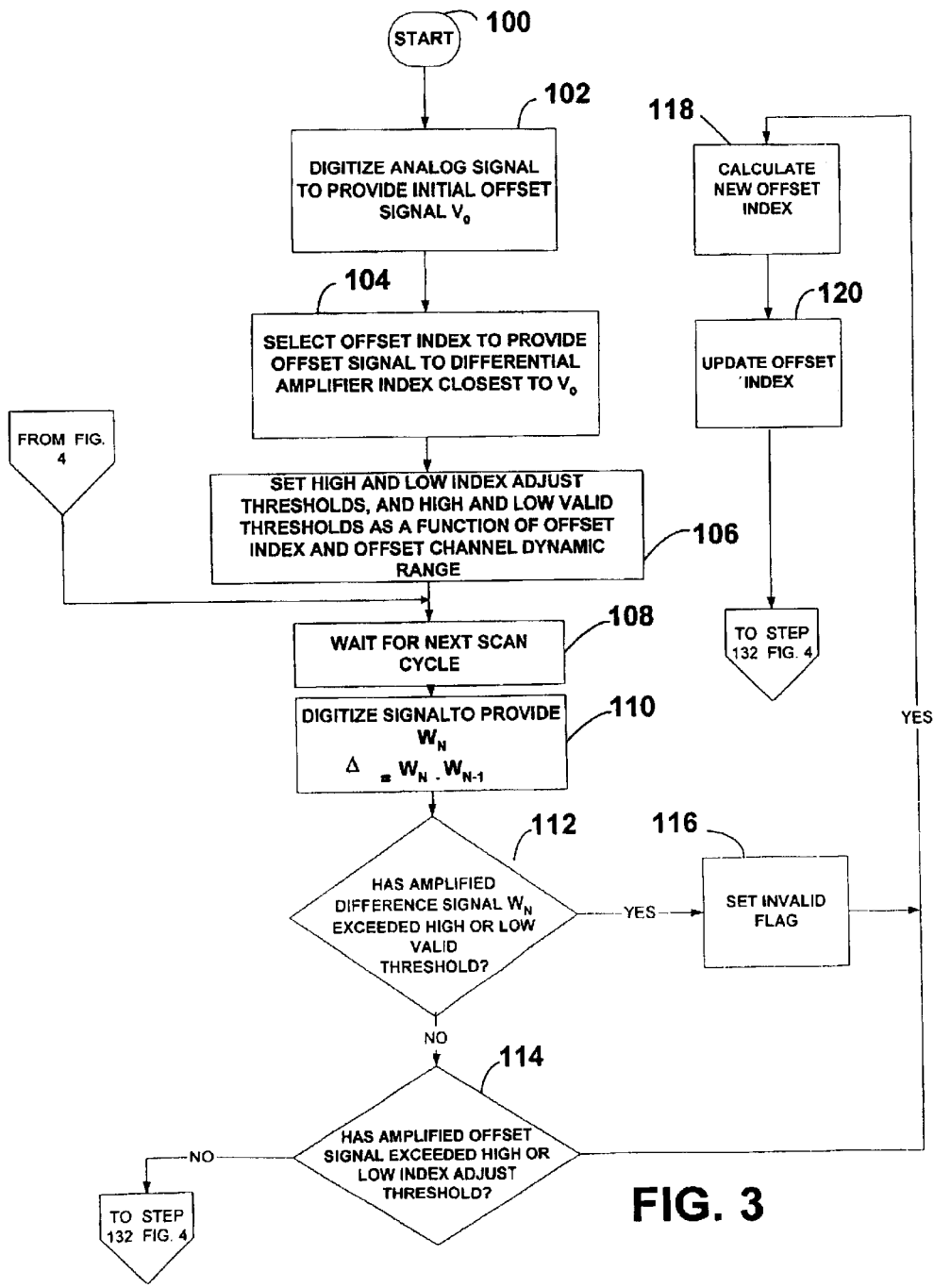
FIG. 3 is a flow diagram illustrating the steps for digitizing an input signal including computing the offset index for the offset channel the A/D converter of FIG. 1.

Now referring to FIGS. 1 and 3, a flow diagram illustrates a process for digitizing an input signal including computing the offset index for the offset channel 16 of the system 10 of FIG. 1. In the flow diagrams of FIGS. 3, 4, 6, and 7, the rectangular elements are herein denoted "processing blocks" (typified by element 102 in FIG. 3) and represent computer software instructions or groups of instructions. The diamond shaped elements in the flow diagrams are herein denoted "decision blocks" (typified by element 112 in FIG. 3) and represent computer software instructions or groups of instructions which affect the operation of the processing blocks. Alternatively, the processing blocks represent steps performed by functionally equivalent circuits such as a digital signal processor circuit or an application specific integrated circuit (ASIC). It will be appreciated by those of ordinary skill in the art that some of the steps described in the flow diagrams may be implemented via computer software while others may be implemented in a different manner (e.g. via an empirical procedure). The flow diagrams do not depict the syntax of any particular programming language. Rather, the flow diagrams illustrate the functional information used to generate computer software to perform the required processing. It should be noted that many routine program elements, such as initialization of loops and variables and the use of temporary variables, are not shown. It will be appreciated by those of ordinary skill in the art that unless otherwise indicated herein, the particular sequence of steps described is illustrative only and can be varied without departing from the spirit of the invention.

The overall process commences in step 100, following which the analog input signal is digitized to provide initial offset signal $V_0$ in step 102. It will be appreciated by those of ordinary skill in the art that $V_0$ can be obtained using the low resolution A/D converter 14 (FIG. 1) or the offset channel 16. The precision of the initial value $V_0$ is derived based on the needs of the application. In some instances, the actual value is relatively unimportant because only the small signal excursions of the analog input signal 12 are of interest. In this case, the initial value $V_0$ can be set to zero or any arbitrary value. When for example, the full value of the analog input signal 12 is desired, the initial output of the low-resolution A/D converter 14 is used. No precision is sacrificed if other sources of noise exceed the resolution and noise characteristics of the low-resolution converter A/D 14.

If higher precision is needed, then an alternative technique is used. For example, calibrating the system using known precision reference voltages and storing calibration factors for subsequent signal construction. If the programmable DC reference voltage of the offset index signal source 28 is sufficiently precise, these known reference values can be used to construct the initial relatively high-resolution output.

In step 104, the offset controller 36 selects an offset index 30 to provide the offset signal to the differential amplifier 20 using an index to provide the offset closest to $V_0$. In step 106, the high and low index adjust thresholds, and high and low valid thresholds are set for the current offset index. The thresholds are calculated in terms of the output of the high resolution A/D converter 26 or the high resolution digital output signal 38. The threshold values are a function of offset index and offset channel dynamic range and can be predetermined or calculated as needed. The valid thresholds are set at a point where the high resolution A/D converter 26 clips (i.e., where the converter is overloaded). The adjust thresholds can be set at a predetermined offset from the valid thresholds and the adjust thresholds can be modified as a function of a priori knowledge of the analog input signal 12.

In step 108, the system 10 waits for next scan cycle and then the high-resolution A/D converter 26 digitizes the amplified difference output $W_N$ in step 110. In step 110, the amplified difference output $W_N$ is stored in memory 40 and a difference $\Delta$ is calculated by subtracting the previous digitized amplified difference signal $W_{N-1}$ from the digitized amplified difference output $W_N$. Initially, the previous digitized amplified difference signal $W_{N-1}$ is set to $(-V_0)$ (i.e. the initial output value is the initial offset plus the initial digitized amplified difference signal).

In step 112, it is determined whether the amplified difference signal $W_N$ exceeded the high or the low valid thresholds. If the amplified difference signal exceeded the high or low valid thresholds, processing continues in step 116, otherwise processing continues in step 114.

In step 114, it is determined whether the amplified difference signal exceeded the high or the low index adjust thresholds. If the amplified difference signal exceeded high or low index adjust thresholds, processing continues in step 118, otherwise processing resumes in step 108.

In step 116, the INVALID flag is set to indicate that the output of the high-resolution A/D converter 26 is not valid because it exceeds either the high or low thresholds and processing continues in step 118. In step 118, a new offset index 30 is calculated. In one embodiment, a new offset index is selected such that the amplified difference signal is near the mid-point of the range of the high-resolution A/D converter 26. In one embodiment, an offset is calculated to place the output data word nearest the center of the high resolution A/D 26 range. In this embodiment, the input signal is nominally 0–5V and the high resolution A/D 26 handles a 0–5V range. If the input is amplified by twenty and there are fifty possible offset values, from 0.05V to 4.95V in increments of 0.10V, given an input signal value of 2.28V and an offset of 2.05V, the difference is 0.23V. After multiplying by 20, this becomes 4.6V, exceeding the adjust threshold and requiring an offset change. It is determined that the amplified difference signal is 4.6V and that the amplification is 20 resulting in the input signal of (4.6−2.5)/20=0.105V higher than needed to place the high resolution signal at the midpoint of its range. Therefore, the new offset should be 1 step (0.1V) higher. Here, the offset would change from 2.05 to 2.15. Using this new offset and the input signal value of 2.28V, the signal at the A/D would be (2.28−2.15)*20=2.6V, which is approximately at the desired 2.5V midpoint.

Figure 4:
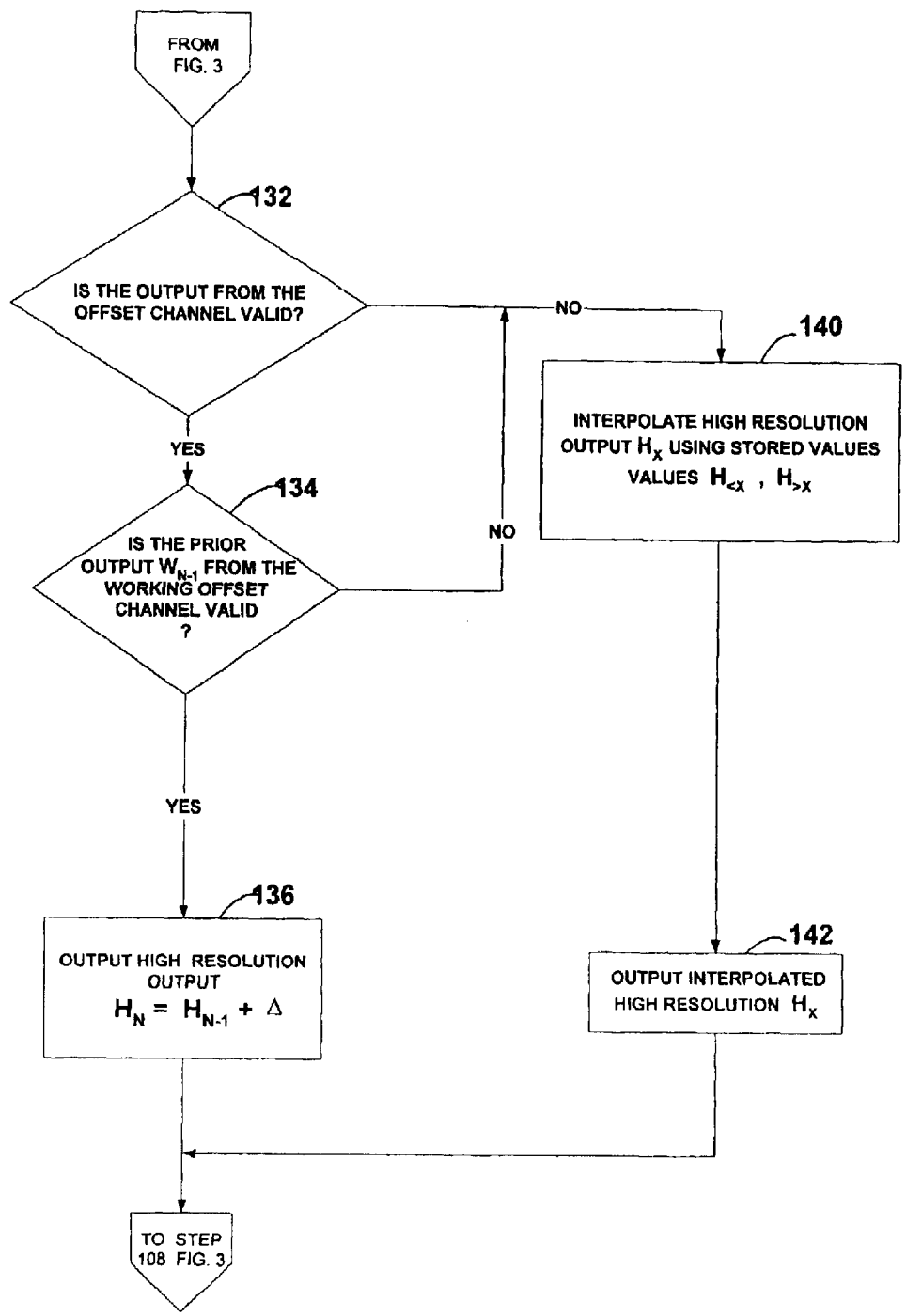
FIG. 4 is a flow diagram illustrating the steps to construct the high resolution digital output signal provided by the A/D converter system of FIG. 1.

In step 120, the offset controller 36 provides the offset index 30 to the offset index signal source 28, and processing continues in step 132 (FIG. 4).

Now referring to FIG. 4, a flow diagram illustrates a process for constructing the high resolution digital output signal 38 provided by the A/D converter system 10 of FIG. 1. The signal construction process continues from step 120 (FIG. 3) after the high resolution A/D conversion is completed and the difference $\Delta$ is calculated, following which a determination whether the output from the offset channel 16 is valid occurs in step 132. If the INVALID flag is set, the output is invalid and processing continues in step 144. Otherwise, processing continues in step 134.

In step 134, it is determined whether the prior output $W_{N-1}$ from the offset channel was valid and whether a prior offset index change affects the accuracy of difference $\Delta$. After an offset index change for a predetermined number of cycles, the difference $\Delta$ cannot be computed with relatively high resolution accuracy. For example, if the offset signal is changed from 2.15 Volts to 2.25 Volts, the offset signal (or alternatively the low resolution A/D converter signal) does not provide the relatively high resolution of the resolution provided by the high resolution A/D converter 26. In this example, without an offset change the difference $\Delta$ would have been computed from the current $W_N$ and a valid $W_{N-1}$ and used to construct a relatively high resolution output reflecting the actual analog input signal 12. Because of the offset change $\Delta$ cannot be computed from two relatively high resolution amplified difference values referenced to a common offset signal and the difference $\Delta$ cannot be computed with relatively high resolution accuracy. If it is determined that $W_{N-1}$ from the working offset channel is valid and the accuracy of $\Delta$ is not affected by an offset index change, then processing continues in step 136. Otherwise processing continues in step 140.

In step 136, the relatively high resolution digital output signal 38 at time N is constructed as follows:

$$H_N = H_{N-1} + \Delta;$$

where $H_N$ is the relatively high resolution digital output signal 38 at time N;

$H_{N-1}$ is the stored high resolution digital output signal 38 at time N−1; and $\Delta$ is the current difference value at time N.

Initially, $H_{N-1}$ is set to zero. Signal construction is accomplished by adding the relatively high-resolution sample-to-sample difference $\Delta$ to $H_{N-1}$. $H_{N-1}$ is equivalent to a running total generated from the initial $V_0$ (determined from the low-resolution A/D output or an alternative technique) and the cumulative relatively high resolution sample to sample differences.

In step 140, the output from the offset channel 16 is not valid or he accuracy of the difference $\Delta$ is affected by an offset change or the validity of $W_{N-1}$ and the signal constructor 34 interpolates stored high resolution outputs $H_{<x}$, $H_{>x}$ to provide $H_x$. Because the interpolation requires stored values of $H_{>x}$, the output of the signal constructor 34 may be delayed. For example if the interpolation uses two samples on either side of the missing value (i.e., two past values plus two future values), then the output would be delayed by two samples in order to have available the "future" values at the time of interpolation. It will be appreciated by those of ordinary skill in the art that there are several methods of interpolation which can be used, including but not limited to, cubic spline interpolation. Because the interpolation may require future values of H, the output of the signal constructor 34 is delayed in order to have available the "future" values at the time the interpolation is performed. It will be appreciated by those of ordinary skill in the art that many data processing systems can tolerate delayed output interpolated values of $H_x$. If time delayed tputs are not acceptable, the output can be extrapolated using stored past values and no output delay would be necessary. Where $W_N$ and $W_{N-1}$ are valid but there was a previous offset change, a calculation of the magnitude of the offset change can be optionally used to supplement to interpolation or extrapolation calculation. Processing continues in step 142.

In step 142, the time delayed interpolated value $H_x$ is output. Because of the time delay it is possible that one or more output values are buffered. Processing resumes in step 108 (FIG. 3).

Referring now to FIG. 5A, a diagram illustrates the working channel amplified difference signal 146 of the system 10' (FIG. 2). At time Ta 148, the working channel amplified difference signal exceeds the high adjust threshold T+ 150 at which point the working offset channel 16w is replaced by one of the guard band offset channels 16a–16i.

Referring now to FIG. 5B, a diagram illustrates one of the guard band offset channels 16a–16i amplified difference signals 152. In order to replace the working offset channel 16w, one of the guard band offset channels 16a–16i must have a valid amplified difference signal, here amplified difference signal 152.

In one example of the operation of the system of FIG. 2, the input signal range is –5 volts to +5 volts. The offset voltages are adjusted in 0.1 volt steps providing an offset index of 0–99 in 100 steps. The amplification at each offset channel 16a–16i and 16w provides that the offset difference signal can vary by +/–0.35 volts without exceeding the range of the high resolution A/D converter 26. For example, if the initial signal value is 2.12 volts, the initial working offset index of the working offset channel 16w is set to twenty-one to provide the offset signal of 2.1 volts, which allows the analog input signal 12 to vary between 1.75 and 2.45 volts without clipping and becoming invalid. The offset indices for two of the guard band offset channels 16a and 16b are set at nineteen and twenty-three providing offsets of 1.9 volts and 2.3 volts, respectively. Here, the low and high offset adjust thresholds are set to –0.25 volts (T–) and +0.25 volts (T+). T– and T+ are equivalent to analog threshold levels of 1.85 and 2.35 volts respectively. The low and high valid thresholds are set to –0.35 volts (V–) and +0.35 volts (V+). V– and V+ are equivalent to analog threshold levels of 1.75 volts and 2.45 volts, respectively. It is noted that a signal in the range of 1.55 to 2.65 volts would provide a valid signal on one or more of the three offset channels (i.e., working offset channel 16w and two guard band offset channels 16a and 16b) is 1.55 to 2.65 volts.

If the input signal exceeds the 2.35 volt working channel index adjust threshold (still within the 1.75 to 2.45 volt working channel valid thresholds on the working channel), then the guard band offset channel 16b using the offset index of twenty-three (2.3 volt) is set as the new working offset value. The offset index for the lower guard band offset channel 16a is changed from nineteen (1.9 volts) to twenty-five (2.5 volts) and the previous working offset channel 16w with offset index twenty-one (2.1 volts) is now a guard band channel. With the working channel offset index set to twenty-three (2.3 volts), the working channel valid range is 1.95 to 2.65 volts, and the working channel index adjust thresholds are set to 2.05 and 2.55 volts, respectively. It is noted, that the adjusted thresholds cause a hysteresis effect that prevents repeated offset changes when the signal hovers about the initial threshold value.

If the analog input signal exceeds the 2.45 volt V+ valid threshold applicable to the current offset in the working offset channel 16w, then the guard band offset channel using the 2.3 volt offset is the new working channel offset value and provides the $W_N$ and $W_{N-1}$ values used to calculate the difference $\Delta$ which is used to calculate the relatively high resolution output. For example, if the input analog signal is 2.5 volts, the The 1.9 volt offset is changed to 2.5 volts and the previous working channel with the 2.1 volt offset would now be considered a guard band channel. With the 2.3 volt offset, the valid range would be 1.95 to 2.65 volts, and the offset adjust thresholds T– and T+ would be set to 2.05 and 2.55 volts, respectively. If the input analog signal exceeded the 2.65 volts then none of the offset channels would have a valid signal.

Figure 6:
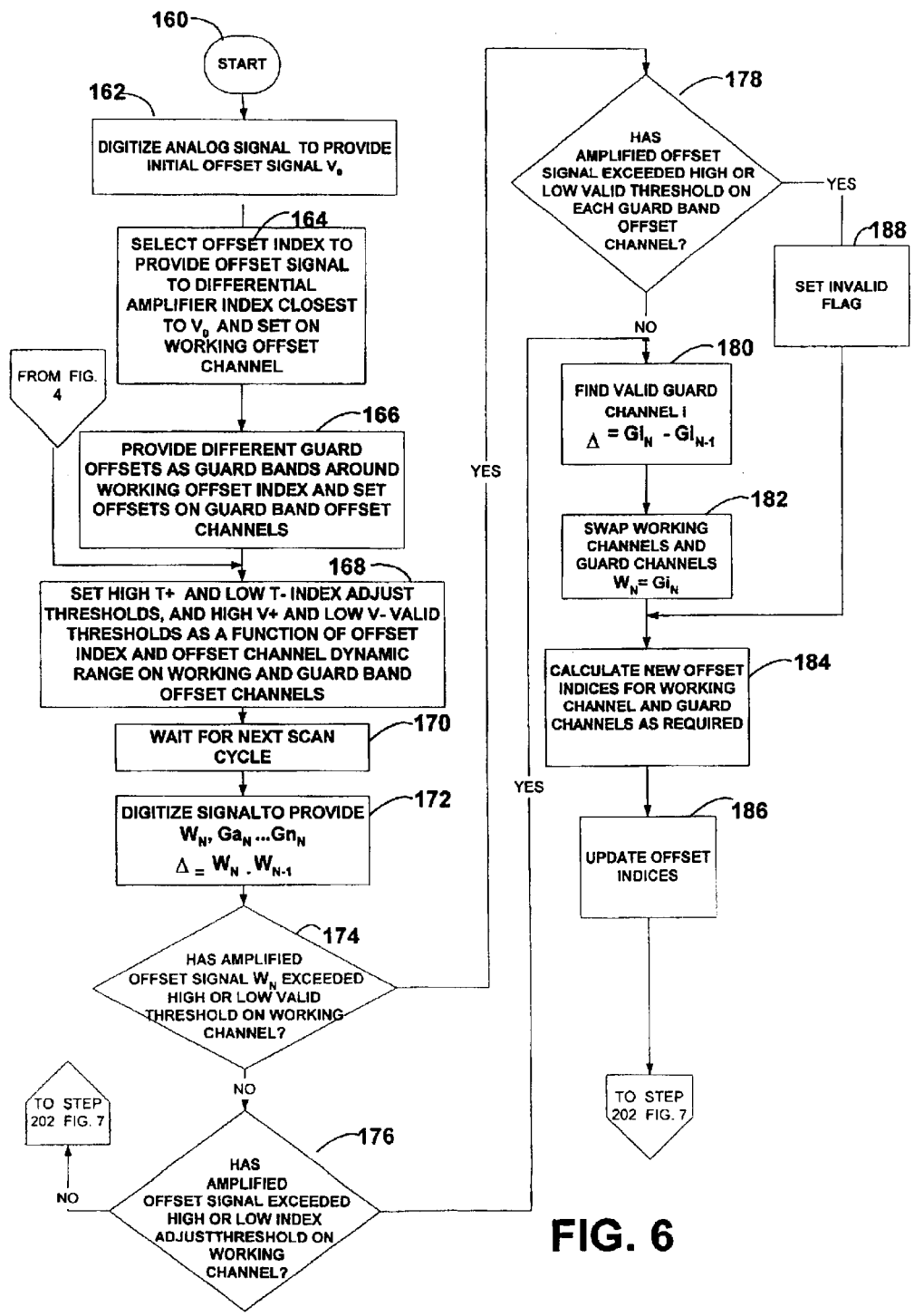
FIG. 6 is a flow diagram illustrating the steps for digitizing an input signal including computing the offset indices for the offset channels provided by the A/D converter system of FIG. 2.

Now referring to FIG. 6, a flow diagram illustrates a process for digitizing an input signal including computing the offset index for the offset channels 16a–16i and 16w of the system 10' of FIG. 2. The overall process commences in step 160, following which the analog input signal is digitized to provide initial offset signal $V_0$ in step 162. It will be appreciated by those of ordinary skill in the art that $V_0$ can be obtained using the optional low resolution A/D converter 14 (FIG. 1) or the offset channel 16. The precision of the initial value $V_0$ is derived based on the needs of the application. In some instances, the actual value is relatively unimportant because only the small signal excursions of the analog input signal 12 are of interest. In this case, the initial value $V_0$ can be set to zero or any arbitrary value. When for example, the full value of the analog input signal 12 is desired, the initial output of the low-resolution A/D is used. No precision is sacrificed if other sources of noise exceed the resolution and noise characteristics of the low-resolution A/D 14.

If higher precision is needed, then an alternative technique is used to determine $V_0$. For example, the offset index values of system 10' are calibrated and stored prior to signal construction. If the programmable DC reference voltage of the offset index signal source 28 is sufficiently stable, the calibrated offset index values are used to construct the initial high-resolution output. Using this technique, the offset index is calculated by writing all possible values to the trimpot 28 and reading the corresponding input value form the low resolution A/D. The goal is to obtain a difference value that is as close to zero as possible. After the initial offset index has been calculated, a relative high resolution value for $V_0$ is determined.

In step 164, the offset controller 36' selects an offset index 30w to provide an offset signal to the differential amplifier using an offset index chosen to provide the offset closest to $V_0$. In step 166, the guard band offset channels 16a–16i are provided with offset indices in order to provide a guard band around the working offset channel 16w. The guard band offsets would be chosen such that when the input signal caused the index adjust threshold to be exceeded the guard band output would be in the middle of its range. Thus, when the guard band becomes the new working channel, it will be in the middle of its range, which minimizes swapping the working channel 16w with one of the guard band offset channels 16a–16i and minimizes the likelihood of encountering an out-of-range situation.

In step 168, the high and low index adjust thresholds T– and T+, and the high and the low valid thresholds V– and V+ are set for the working channel. The thresholds are calculated for comparison to the output of the high resolution A/D converter 26 in the working offset channel 16w or the output of the low resolution A/D converter 14. The threshold values are a function of offset index and offset channel dynamic range. In one embodiment, the valid thresholds are set at a point where the high resolution A/D converter 26 clips (i.e., where the converter is overloaded and exceeding the threshold can be detected by a predetermined digital output pattern, for example, all "1s" or all "0s"). In an alternative embodiment, the adjust thresholds are set at a predetermined offset from the valid thresholds. The adjust thresholds can be modified as a function of a priori knowledge of the analog input signal 12. Valid thresholds V−, V+ are set in a similar manner for the guard band offset channels 16a–16i.

In step 170, the system 10 waits for next scan cycle and then the high-resolution A/D converter 26 on the working offset channel 16w digitizes the amplified difference output $W_N$ in step 170. Each of the high-resolution A/D converters on the guard band offset channels 16a–16i digitizes the corresponding amplified difference output $Ga_N$-$Gi_N$. Additionally in step 172, a difference $\Delta$ is calculated by subtracting the previous digitized working offset channel amplified difference signal $W_{N-1}$ from the digitized working offset channel amplified difference output $W_N$. Initially, the previous digitized amplified difference signal $W_{N-1}$ is set to $(-V_0)$ (i.e. the initial output value is the initial offset plus the initial digitized amplified difference signal. Alternatively, the difference $\Delta$ is calculated as an average of the differences at time N and time N−1 in the working channel 16w and guard band channels 16a–16i that have valid differences. The amplified difference outputs $W_N$ and $Ga_N$-$Gi_N$ are store with an indication of validity in memory 40 (FIG. 2).

In step 174, it is determined whether the amplified difference signal $W_N$ on the working offset channel exceeded the high (i.e. greater than V+) or the low (i.e., lower than V−) valid thresholds. If the working offset channel amplified difference signal exceeded high or low valid thresholds, processing continues in step 178, otherwise processing continues in step 176.

Figure 7:
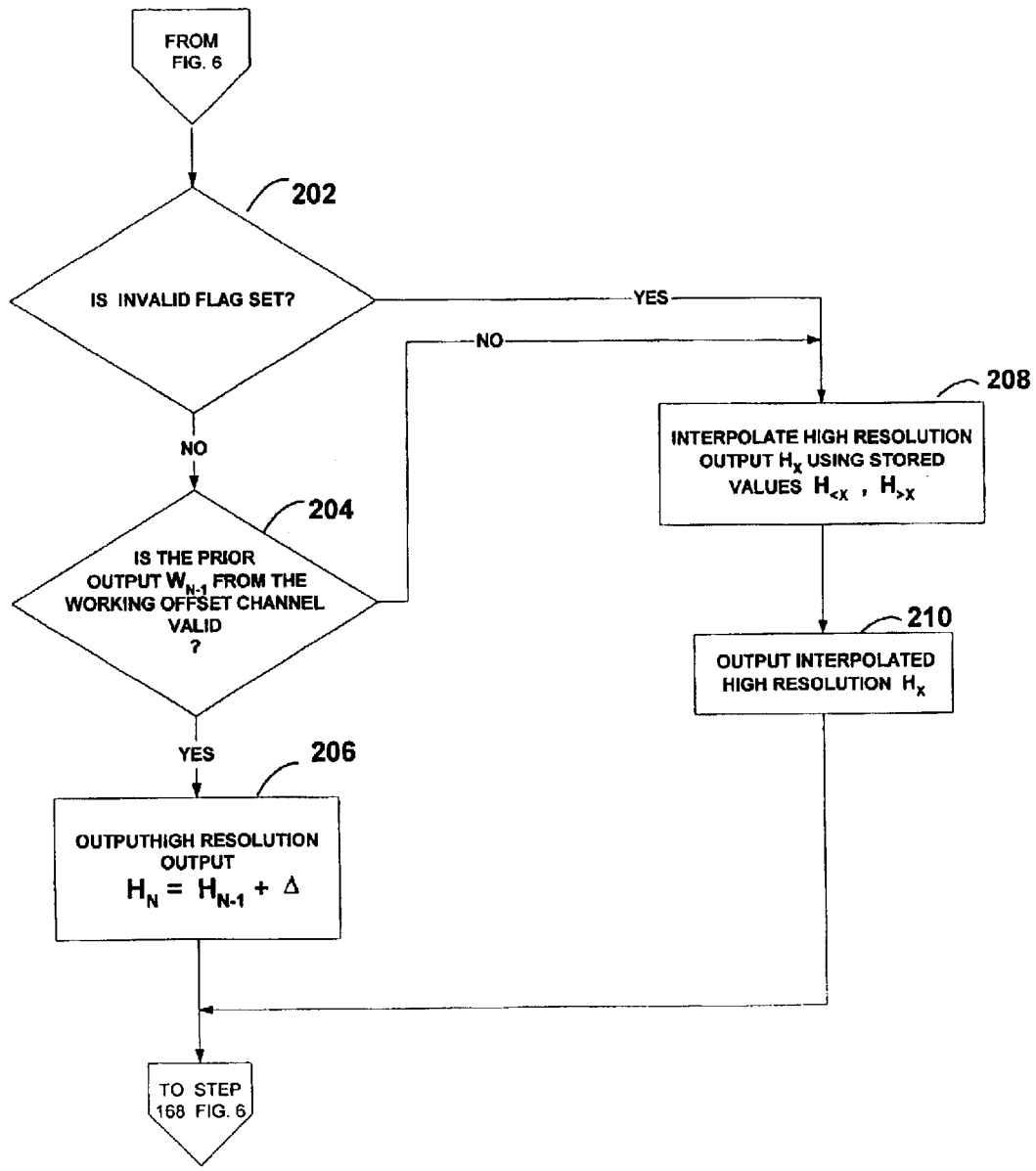
FIG. 7 is a flow diagram illustrating the steps to construct the high resolution output of the A/D converter system of FIG. 2.

In step 176, it is determined whether the working offset channel amplified difference signal exceeded the high or the low index adjust thresholds T+ and T−. If the working offset channel amplified difference signal exceeded high or low index adjust thresholds T+ and T−, processing continues in step 180. When the input signal slews drifts up or down exceeding the high or the low index adjust thresholds T+ and T− of the working offset channel, one of the guard band offset channels having the next best offset is selected for the subsequent working channel. The offset channel having the least optimal offset (i.e., the offset value furthest from the input signal) is adjusted so that the guard bands provide more or less symmetric coverage about the working channel. As an example, suppose the working channel offset was 2.05V and that guard bands have offsets at 2.15V and 1.95V. Suppose further that the input signal increases such that the working channel offset needs to change from 2.05V to 2.15V. When this happens, the 1.95V offset is changed to become 2.25V. The previous guard band with the 2.15V offset becomes the new working channel, and the previous working channel with offset at 2.05V becomes a guard band channel along with the new 2.25V guard band. Otherwise processing resumes in step 202 (FIG. 7).

In step 178, it is determined whether the amplified difference signal on each of the guard band offset channels exceeded the high (i.e. greater than V+) or the low (i.e., lower than V−) valid thresholds. If the amplified difference signal on each of the guard band offset channels exceeded the corresponding high or low valid thresholds, processing continues in step 188, otherwise processing continues in step 180.

In step 180, at least one guard channel Gi is found having a valid digitized amplified difference output $Gi_N$ and a valid stored digitized amplified difference output $Gi_{N-1}$. The difference $\Delta$ is calculated by:

$$\Delta = Gi_N - Gi_{N-1};$$

where $Gi_N$ is the current digitized amplified difference output on guard band offset channel 16i; and $Gi_{N-1}$ is the stored digitized amplified difference output on guard band offset channel 16i an time N−1 (i.e., the previous cycle).

In step 182, the working offset channel 16w is swapped with the guard band offset channel 16i, and the current working offset channel digitized amplified difference output $W_N$ is set to the current digitized amplified difference output on guard band offset channel 16i $Gi_N$ before it is stored for use in step 172 on the next cycle. It is understood that the channel swap can be controlled in software so that no physical connections are changed when the channels are swapped.

In step 184, new offset indices are calculated where required for the working offset channel and the guard band offset channels. In one embodiment where there are three offset channels (a working offset channel 16w plus two guard band offset channels 16a and 16b), variables are assigned identifying the present addresses of the working channel 16w, the upper guard band offset channel 16a, and the lower guard band offset channel 16b. The index is a number used to provide input to the offset index signal source 28 which provides the offset signal to the differential amplifier. If for example, there are fifty offset values ranging from 0.05V to 4.95V in increments of 0.10V, then there would be fifty offset indices corresponding to these offset signals. There is a functional relationship between index and offset signal value such that the index is computed or alternatively, a lookup table is used.

In step 186, the offset controller 36' provides the offset indices to the corresponding working offset channel 16w and the guard band offset channels 16a–16i, and processing continues in step 202 (FIG. 7).

As an example of adjusting the offset indices, consider a system 10' having three offset channels 16a, 16b and 16w. If either of the high or low valid thresholds or either of the high or low index adjust thresholds are exceeded the one or more offset index is adjusted. If either low threshold is exceeded then one or more offset index needs to be lowered. If either high threshold is exceeded then one or more offset index may be raised in the proper direction. If no threshold is exceeded on any channel, then the offset indices are not adjusted.

In this example, the upper guard band 16a and the working channel did not exceed the valid threshold, the working channel exceeded the high adjust channel, and the lower guard band 16b exceeded the high valid threshold. As illustrated in Table 1 below, the lower channel 16b becomes the new upper guard band channel with a new offset index of one greater than the previous guard band channel. Here it was not necessary to adjust the offset index on offset channels 16a and 16w, which allows the signal to signal differences on these channels to remain valid and accurate. It will be appreciated by those of ordinary skill in the art that it is not always necessary to adjust all of the indices and also that in some situations an offset index is modified by more than one unit in order to track the slew rate in the analog input signal 12.

TABLE 1

| CHANNEL | OFFSET INDEX | VALID DIFFERENCE | ADJUST |
|---|---|---|---|
| Before Offset Adjustment: | | | |
| 16a | 30 | YES | |
| 16w | 29 | YES | YES (working channel) |
| 16b | 28 | YES | |
| After Offset Adjustment: | | | |
| 16b | 31 | MAYBE | |
| 16a | 30 | YES | (assigned as new working channel) |
| 16w | 29 | YES | |

The validity of the output depends on the type of high resolution A/D 26 used in the offset channel 16a–16i and 16w. The output of the channel with the newly changed offset (16b with index 31) may be valid immediately. However, if there is a settling time following a step change in the input, then the output requires a settling time has occurred before using the output of the new channel. For instance, with the AD7716, there is an internal digital finite impulse response (FIR) filter that requires four sample times before its output is accurate following an offset change. A flag is used for each channel to determine when the values from the high resolution A/D 26 for each channel 16 can be considered valid.

In step 188, the INVALID flag is set to indicate that the output of each of the high-resolution A/D converters is not valid because it is clipped at either the high or low Valid thresholds V+, V− and processing continues in step 184.

Now referring to FIG. 7, a flow diagram illustrates a process for constructing the high resolution digital output signal 38 provided by the A/D converter system 10' of FIG. 2. The signal construction process continues from step 184 (FIG. 6) after the high resolution A/D conversions in the working offset channel and the guard band offset channels are completed and the difference Δ is calculated, following which a determination whether the output from the each of the working offset channel 16w and the guard band offset channels 16a–16i is invalid occurs in step 132. If the INVALID flag is set, the outputs are invalid and processing continues in step 208. Otherwise, processing continues in step 204.

In step 204, it is determined whether the prior output $W_{N-1}$ from the present offset channel is valid and whether a prior offset index change affects the accuracy of difference Δ. A prior offset index change affecting the validity of $W_{N-1}$ affects the accuracy of Δ. After an offset index change for a predetermined number of cycles, the difference Δ cannot be computed with the relatively high resolution accuracy as described in conjunction with step 134 (FIG. 4). If it is determined that $W_{N-1}$ from the present offset channel is valid and the accuracy of Δ is not affected by an offset index change, then processing continues in step 206. Otherwise processing continues in step 208.

In step 206, the relatively high resolution digital output signal 38 at time N is constructed as follows:

$$H_N = H_{N-1} + \Delta;$$

where $H_N$ is the relatively high resolution digital output signal 38 at time N;

$H_{N-1}$ is the stored relatively high resolution digital output signal 38 at time N−1; and Δ is the current difference value at time N.

Initially, $H_{N-1}$ is set to zero. Signal construction is accomplished by adding the high-resolution sample-to-sample difference Δ to a running total ($H_{N-1}$) generated from the initial $V_0$ (determined from the low-resolution A/D output or an alternative technique). Processing resumes in step 168 (FIG. 6).

In step 208, the accuracy of the difference Δ is affected by an offset change or the output signals are invalid. The signal constructor 34' interpolates stored high resolution outputs $H_{<x^-}$, $H_{>x}$ to provide $H_x$, where X is the time following the offset change, and optionally using the offset value at time X after the offset change. Because the interpolation requires stored values of $H_{>x^-}$, the output of the signal constructor 34' is delayed. It will be appreciated by those of ordinary skill in the art that many data processing systems can tolerate delayed output interpolated values of $H_x$. It should be noted that if the input signal is tracked such that it remains within the dynamic range of the offset channels of system 10', then no interpolation is required. In step 210, the time delayed interpolated value $H_x$ is output. Because of the time delay it is possible that one or more output values are buffered. Processing resumes in step 168 (FIG. 6).

All publications and references cited herein are expressly incorporated herein by reference in their entirety.

Having described the preferred embodiments of the invention, it will now become apparent to one of ordinary skill in the art that other embodiments incorporating their concepts may be used. It is felt therefore that these embodiments should not be limited to disclosed embodiments but rather should be limited only by the spirit and scope of the appended claims.

What is claimed is:

1. An analog-to-digital converter system for sampling an input signal, comprising:
   at least one offset channel comprising:
      a differential amplifier having a signal input coupled to the input signal, an offset input for receiving an offset signal and an amplified difference output;
      an analog-to-digital converter having a signal input coupled to the amplified difference output and having a signal output; and
      an offset index signal source coupled to the differential amplifier offset input;
   an offset controller having at least one output coupled to a corresponding at least one offset index signal source and at least one input coupled to a corresponding at least one analog-to-digital converter signal output; and
   a signal constructor having at least one input coupled to the corresponding at least one analog-to-digital converter signal output and operable to provide a relatively high resolution digital output signal.

2. The system of claim 1 wherein the signal constructor further comprises a memory for storing at least one offset index.

3. The system of claim 1 wherein the signal constructor further comprises a memory for storing at least one relatively high resolution digital output signal.

4. The system of claim 3 wherein the signal constructor further comprises a memory for storing at least one analog-to-digital converter signal output.

5. The system of claim 1 wherein the offset controller further comprises a threshold detector coupled to at least one analog-to-digital converter signal output.

6. The system of claim 1 further comprising a relatively low resolution analog-to-digital converter having a signal input coupled to the input signal and having a digitized signal output coupled to the signal constructor.

7. The system of claim 6 wherein the low resolution analog-to-digital converter digitized output is adapted to provide the offset index signal.

8. An analog-to-digital converter system for sampling an input signal, comprising:
a plurality of offset channels, each channel comprising:
a differential amplifier having a signal input coupled to the input signal, an offset input for receiving an offset signal and an amplified difference output; and
an analog-to-digital converter having a signal input coupled to the amplified difference output and having a signal output; and
an offset controller having a plurality of outputs coupled to corresponding ones of the plurality of offset channels and a plurality of inputs coupled to corresponding ones of the plurality of the plurality of analog-to-digital converter signal outputs.

9. The system of claim 8 further comprising a signal constructor coupled to each of the plurality of the analog-to-digital converter signal outputs and operable to provide a relatively high resolution digital output signal.

10. The system of claim 9 wherein the signal constructor further comprises a memory for storing at least one offset index.

11. The system of claim 9 wherein the signal constructor further comprises a memory for storing at least one relatively high resolution digital output signal.

12. The system of claim 9 wherein the signal constructor further comprises a memory for storing at least one analog-to-digital converter signal output.

13. The system of claim 8 wherein the offset controller further comprises a threshold detector coupled to the at least one analog-to-digital converter signal output.

14. The system of claim 8 further comprising a relatively low resolution analog-to-digital converter having a signal input coupled to the input signal and having a signal output operable to provide a digitized output.

15. The system of claim 14 wherein the low resolution analog-to-digital converter digitized output is adapted to provide an offset index signal.

16. The system of claim 8 wherein each of the offset channels further comprises a digital trimpot coupled to a precision voltage source and operable to receive an offset index signal from the offset controller.

17. A method for digitizing an analog input signal comprising:
providing at least one offset channel coupled to the analog signal;
providing an offset index to each of the at least one offset channels for providing an offset signal;
calculating a threshold for at least one offset channel;
subtracting the offset signal from the analog signal to provide a difference signal;
amplifying the difference signal;
digitizing the amplified difference signal at each of the at least one offset channels;
storing a at least one offset channel digitized amplified difference signal; and
calculating a difference between the digitized amplified difference signal and a stored offset channel digitized amplified difference signal.

18. The method of claim 17 further comprising constructing a relatively high resolution output from the calculated difference and a stored relatively high resolution output.

19. The method of claim 17 further comprising constructing an initial relatively high resolution output from an initial digitized analog signal value and an initial digitized amplified difference signal.

20. The method of claim 17 further comprising:
sensing whether the digitized amplified difference signal has exceeded the threshold of the at least one offset channel; and
adjusting at least one offset index in response to sensing that the digitized amplified difference signal has exceeded the threshold of the at least one offset channel.

21. The method of claim 20 wherein the threshold is an index adjust threshold.

22. The method of claim 20 further comprising:
determining that adjusting at least one offset index has affected the accuracy of the calculated difference; and
interpolating a plurality of stored relatively high resolution output to provide relatively high resolution output.

23. The method of claim 22 further comprising interpolating an offset index difference and at least one stored relatively high resolution output to provide a relatively high resolution output.

24. The method of claim 20 further comprising calculating a valid threshold for at least one offset channel.

25. The method of claim 24 further comprising:
determining that the digitized amplified difference analog signal exceeds the valid threshold for the at least one offset channel; and
interpolating a relatively high resolution output from a plurality of stored relatively high resolution outputs.

26. A method for converting an analog input signal comprising:
providing a plurality of offset channels coupled to the analog input signal;
selecting one of the plurality of offset channels as a working offset channel;
providing a different offset index to each of the plurality of offset channels to provide a corresponding plurality of offset signals;
subtracting the plurality of offset signals from the analog input signal to provide a corresponding plurality of difference signals;
amplifying the plurality of difference signals;
digitizing each of the plurality of amplified difference signals;
calculating a threshold for the working offset channel;
sensing whether the working offset channel amplified difference signal has exceeded the threshold of the working offset channel;
storing a working offset channel digitized amplified difference signal;
calculating a difference between the working offset channel digitized amplified difference signal and the stored working offset channel digitized amplified difference signal; and
adjusting selected ones of the offset indices in response to sensing that the working offset channel digitized amplified difference signal has exceeded the threshold.

27. The method of claim 26 further comprising constructing a relatively high resolution output from the calculated difference and a stored relatively high resolution output.

28. The method of claim 27 further comprising storing relatively high resolution output.

29. The method of claim 26 further comprising constructing an initial relatively high resolution output from an initial digitized analog signal value and an initial digitized amplified difference signal.

30. The method of claim 26 further comprising:

sensing whether the working offset channel digitized amplified difference signal has exceeded the threshold of the working offset channel; and swapping the working offset channel with a different one of the plurality of offset channels index in response to sensing that the working offset channel digitized amplified difference signal has exceeded the threshold of the working offset channel.

31. The method of claim 26 wherein the threshold is an index adjust threshold.

32. The method of claim 31 further comprising calculating a valid threshold for at least one offset channel.

33. The method of claim 32 further comprising:

determining that the working offset channel digitized amplified difference analog signal exceeds the valid threshold;

determining that at least one offset channel digitized amplified difference analog signal and a corresponding stored digitized amplified difference signal are valid; and calculating a difference between the valid digitized amplified difference signal and the corresponding stored digitized amplified difference signal.

34. The method of claim 32 further comprising:

determining that each of the plurality of offset channels digitized amplified difference analog signal exceeds a corresponding valid threshold; and interpolating a plurality of stored relatively high resolution outputs to provide a relatively high resolution output.

35. The method of claim 31 further comprising digitizing the input signal at a relatively low resolution analog-to-digital converter for providing the offset index.

36. The method of claim 35 further comprising constructing a relatively high output signal by combining the low resolution digital signal and selected ones of the digital signals of the plurality of offset channels.

37. The method of claim 31 wherein sensing whether the amplified offset signal has exceeded the threshold of the working offset channel comprises:

digitizing the analog signal with a relatively low resolution analog to digital converter; and comparing the digitized relatively low resolution signal with the threshold.

38. The method of claim 31 wherein sensing whether the amplified difference signal has exceeded the threshold of the working offset channel comprises comparing the digitized working offset channel amplified offset analog signal with the threshold.

39. The method of claim 26 wherein the threshold is a valid threshold.

40. The method of claim 26 comprising determining that adjusting at least one offset index has affected accuracy of the calculated difference; and interpolating a plurality of stored relatively high resolution outputs to provide a relatively high resolution output.

* * * * *

UNITED STATES PATENT AND TRADEMARK OFFICE
CERTIFICATE OF CORRECTION

PATENT NO. : 6,784,820 B1
APPLICATION NO. : 10/409844
DATED : August 31, 2004
INVENTOR(S) : James William Casalegno et al.

It is certified that error appears in the above-identified patent and that said Letters Patent is hereby corrected as shown below:

The title page should be deleted to appear as per attached title page.

The sheets of drawings consisting of figures 1A, 2A 5A and 5B should be deleted to appear as per attached drawing sheets.

Column 16, line 16 delete "H>x.," and replaces with --H>x,--.

Column 16, line 23 delete "delay it" and replace with --delay, it--.

Column 17, line 18 delete "of the plurality of the plurality" and replace with --of the plurality--.

Column 17, line 59 delete "a at least" and replace with --at least--.

Column 20, line 27 delete "affected accuracy" and replace with --affected the accuracy--.

Signed and Sealed this

Twelfth Day of February, 2008

JON W. DUDAS
*Director of the United States Patent and Trademark Office*

(12) United States Patent
Casalegno et al.

(10) Patent No.: US 6,784,820 B1
(45) Date of Patent: *Aug. 31, 2004

(54) HIGH RESOLUTION, HIGH DYNAMIC RANGE ANALOG-TO-DIGITAL CONVERTER SYSTEM AND RELATED TECHNIQUES

(75) Inventors: James William Casalegno, Bristol, RI (US); Frank Philip Monte, Newport, RI (US); Eric Kent Slater, Long Beach, CA (US); Kirk K. Kohnen, Fullerton, CA (US)

(73) Assignee: Raytheon Company, Waltham, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/409,844

(22) Filed: Apr. 9, 2003
(Under 37 CFR 1.47)

(51) Int. Cl.⁷ .................................. H03M 1/12
(52) U.S. Cl. ......................... 341/155; 341/156
(58) Field of Search ................. 341/155, 118, 341/120, 156, 166

(56) References Cited

U.S. PATENT DOCUMENTS

| | | | | |
|---|---|---|---|---|
| 4,876,544 A | * | 10/1989 | Kuraishi | 341/166 |
| 5,392,039 A | * | 2/1995 | Thurston | 341/143 |
| 5,898,395 A | * | 4/1999 | Werrbach et al. | 341/118 |
| 6,081,215 A | * | 6/2000 | Kost et al. | 341/120 |
| 6,275,540 B1 | * | 8/2001 | Barrett et al. | 375/316 |
| 6,437,717 B1 | * | 8/2002 | Van der Ploeg et al. | 341/118 |
| 6,441,767 B1 | * | 8/2002 | Frazier | 341/155 |
| 6,445,329 B1 | * | 9/2002 | Abassi et al. | 341/156 |

* cited by examiner

Primary Examiner—Jean Bruner Jeanglaude
(74) Attorney, Agent, or Firm—Daly, Crowley & Mofford, LLP

(57) ABSTRACT

An analog-to-digital converter system for sampling an input signal includes at least one offset channel. Each channel includes a differential amplifier with a signal input coupled to the input signal, an offset input for receiving an offset signal and an amplified difference output, an analog-to-digital converter having a signal input coupled to the amplified difference output and having a signal output, and an offset index signal source coupled to the differential amplifier offset input. The system further includes an offset controller having at least one output coupled to a corresponding at least one offset index signal source and at least one input coupled to a corresponding at least one analog-to-digital converter signal output. The system also includes a signal constructor having at least one input coupled to a corresponding at least one analog-to-digital converter signal output and operable to provide a relatively high resolution digital output signal.

40 Claims, 9 Drawing Sheets

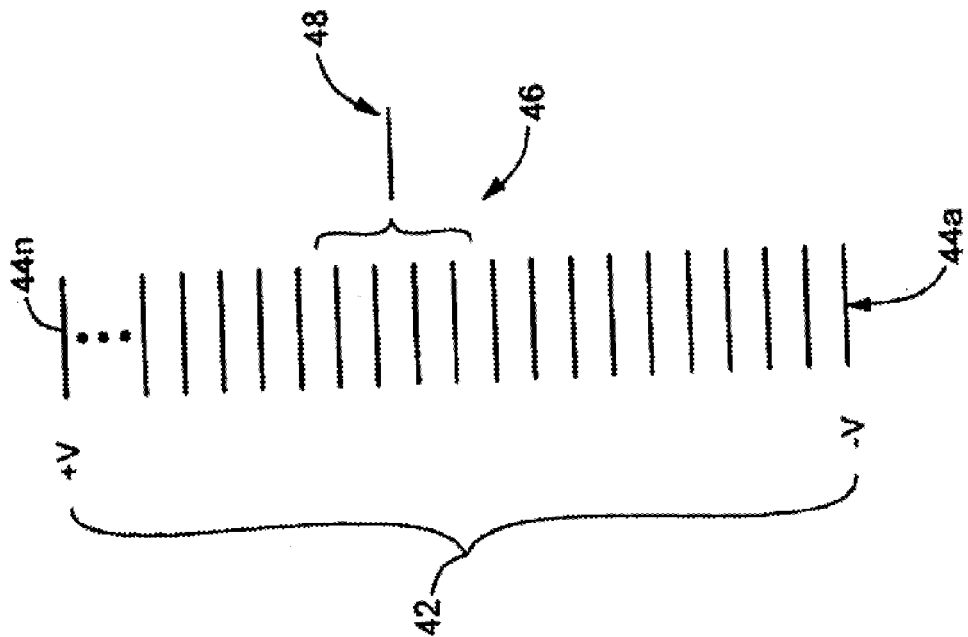

UNITED STATES PATENT AND TRADEMARK OFFICE
CERTIFICATE OF CORRECTION

PATENT NO.        : 6,784,820 B1                              Page 3 of 4
APPLICATION NO. : 10/409844
DATED              : August 31, 2004
INVENTOR(S)       : James William Casalegno et al.

It is certified that error appears in the above-identified patent and that said Letters Patent is hereby corrected as shown below:

Replace Drawing Sheet 4 of 9 (FIG. 2A) with:

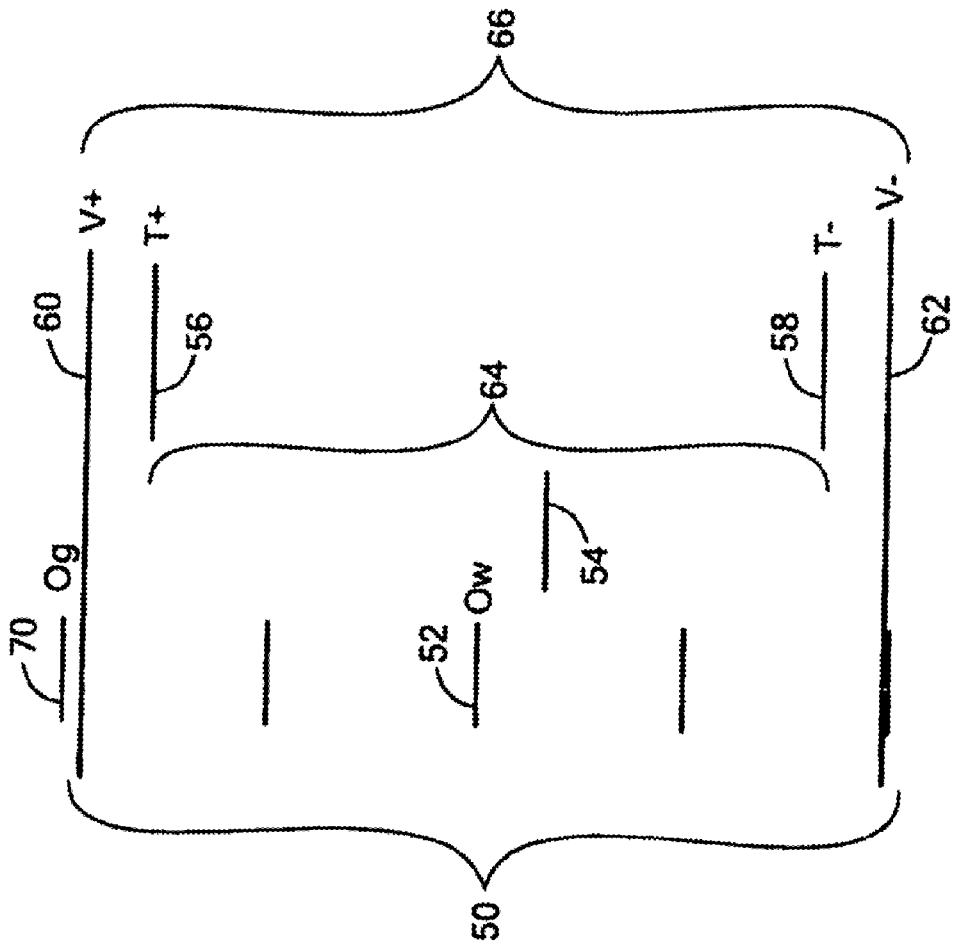

UNITED STATES PATENT AND TRADEMARK OFFICE
CERTIFICATE OF CORRECTION

PATENT NO.         : 6,784,820 B1
APPLICATION NO.    : 10/409844
DATED              : August 31, 2004
INVENTOR(S)        : James William Casalegno et al.

It is certified that error appears in the above-identified patent and that said Letters Patent is hereby corrected as shown below:

Replace Drawing Sheet 7 of 9 (FIGS. 5A & 5B) with:

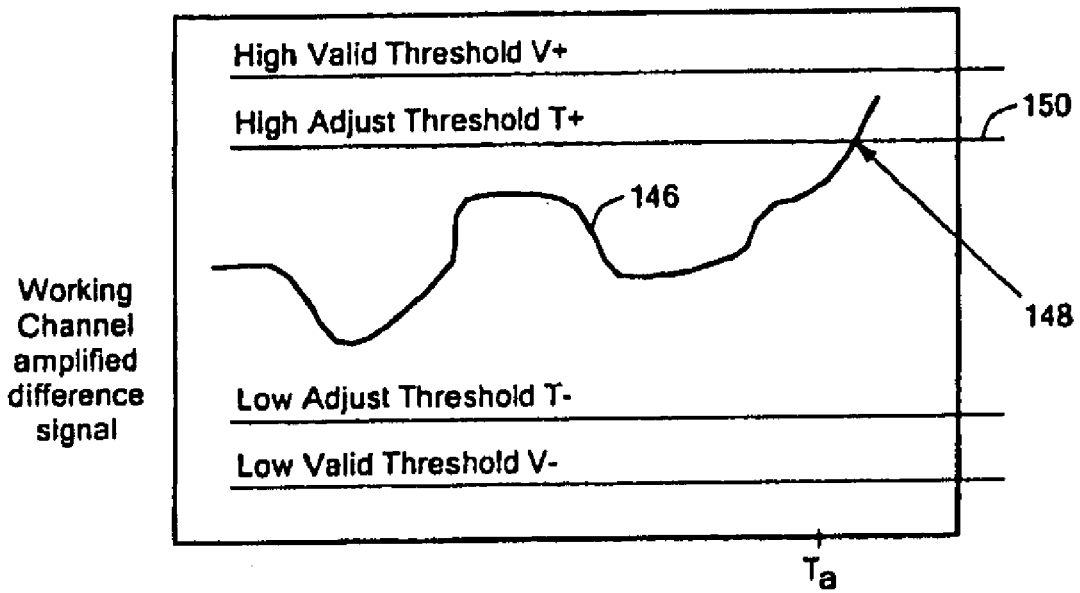

FIG. 5A

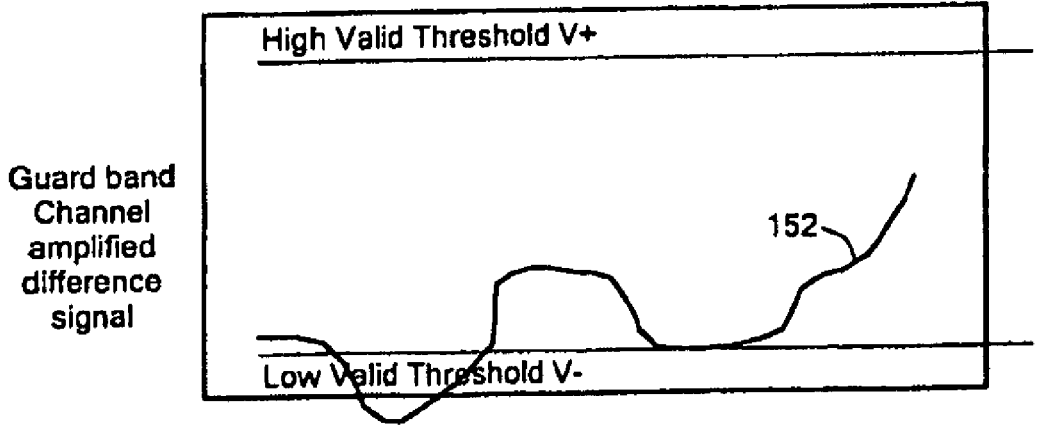

FIG. 5B